United States Patent
Han

(10) Patent No.: US 8,680,525 B2
(45) Date of Patent: Mar. 25, 2014

(54) THIN FILM TRANSISTOR AND MANUFACTURING METHOD THEREOF

(75) Inventor: Chang Wook Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1323 days.

(21) Appl. No.: 11/961,894

(22) Filed: Dec. 20, 2007

(65) Prior Publication Data

US 2008/0105876 A1 May 8, 2008

Related U.S. Application Data

(62) Division of application No. 11/172,070, filed on Jun. 30, 2005, now Pat. No. 7,332,382.

(30) Foreign Application Priority Data

Sep. 24, 2004 (KR) .................................. 2004-77446

(51) Int. Cl.
*H01L 29/04* (2006.01)

(52) U.S. Cl.
USPC .......... 257/57; 257/59; 257/66; 257/E29.117; 257/E29.151; 257/E21.414; 438/149

(58) Field of Classification Search
USPC .......... 257/57, 59, 66, 72, E21.414, E29.151, 257/E29.117; 438/30, 149, 151, 158, 159
See application file for complete search history.

(56) References Cited

U.S. PATENT DOCUMENTS

| | | | | |
|---|---|---|---|---|
| 5,808,316 A | * | 9/1998 | Matsuda et al. | 257/66 |
| 6,027,987 A | * | 2/2000 | Yamazaki et al. | 438/486 |
| 6,362,028 B1 | * | 3/2002 | Chen et al. | 438/149 |
| 6,787,433 B2 | * | 9/2004 | Mitani et al. | 438/479 |
| 2002/0153579 A1 | * | 10/2002 | Yamamoto | 257/412 |

FOREIGN PATENT DOCUMENTS

KR 1020040059088 A 7/2004

OTHER PUBLICATIONS

Office Action issued in corresponding Korean Patent Application No. 10-2004-0077446, mailed Jan. 18, 2011.

* cited by examiner

*Primary Examiner* — David Vu
(74) *Attorney, Agent, or Firm* — Brinks, Gilson & Lione

(57) ABSTRACT

A method for manufacturing a thin film transistor is provided. In the method, a gate electrode is formed on a substrate. A crystalline gate insulating layer is formed on an entire surface of the substrate having the gate electrode formed thereon. A microcrystalline silicon layer and a doped amorphous silicon layer are sequentially formed on the crystalline gate insulating layer. A metal layer is deposited on the substrate including the crystalline gate insulating layer, the microcrystalline silicon layer and the doped amorphous silicon layer. Source and drain electrodes, an ohmic contact layer and an active layer are formed by etching predetermined portions of the metal layer and the doped amorphous silicon layer to expose a predetermined portion of the microcrystalline silicon layer.

9 Claims, 6 Drawing Sheets

THIN FILM TRANSISTOR AND MANUFACTURING METHOD THEREOF

RELATED APPLICATIONS

This application is a divisional application and claims the benefit of U.S. patent application Ser. No. 11/172,070, filed on Jun. 30, 2005 now U.S. Pat. No. 7,332,382, which claims priority to Korean Patent Application No. 77446/2004, which was filed on Sep. 24, 2004, and which is incorporated herein by reference.

BACKGROUND

1. Technical Field

The present invention relates to a thin film transistor (TFT), and more particularly, to a TFT used as a driving device for a liquid crystal display device (LCD) or a switching/driving device for an organic light emitting diode device (OLED) and a manufacturing method thereof.

2. Background Information

As our society rapidly develops into an information-oriented society, flat panel displays having the attributes of slimness, low weight and low power consumption have become widely used. Among the various types of flat panel displays, the liquid crystal display (LCD) and the organic light emitting diode (OLED) device provide excellent resolution, color reproduction capability and image quality. Owing to these advantages, the LCD in particular is widely used in notebook computers and desktop computers.

The LCD operates by exploiting the optical anisotropy and polarization of liquid crystal molecules, or liquid crystals. Liquid crystals have an elongated thin molecular structure and tend to orient themselves in an orderly molecular arrangement. The orientation and direction of the molecular arrangement can be controlled by applying an electric field thereto.

Accordingly, it is possible to display images by suitably changing the molecular arrangement of the liquid crystals and utilizing their optical anisotropy to altering the polarization state of light.

The LCD includes two substrates positioned in opposition to each other with a liquid crystal layer interposed therebetween. Each substrate has an electrode for generating an electric field. The LCD displays images by controlling molecules of the liquid crystal layer using an electric field generated by a voltage applied to the electrodes of the respective substrates.

Specifically, an active matrix (AM) LCD includes on its lower substrate a thin film transistor (TFT), which serves as a switching device. Also, an AM OLED uses a TFT as a switching/driving device.

The active layer of such a TFT typically is made of amorphous silicon (a-Si) because the a-Si can be easily formed on an inexpensive large substrate such as glass at a low temperature.

FIGS. 1A to 1C are cross-sectional views illustrating a manufacturing process for a related art TFT.

Referring first to FIG. 1A, a conductive metal, for example, Al or AlNd, is deposited on a substrate 10 by a sputtering process or the like in order to form a metal layer on the substrate 10. Thereafter, the metal layer is patterned using photolithography, thereby forming a gate electrode 20 on the substrate 10.

Referring to FIG. 1B, a gate insulating layer 30 is formed on an entire surface of the substrate 10 in such a way as to cover the gate electrode 20 formed on the substrate 10. Typically, the gate insulating layer 30 is made of an amorphous insulating material such as SiNx.

Next, an a-Si layer 40 is deposited on the gate insulating layer 30 through chemical vapor deposition (CVD). Typically, the a-Si layer 40 is deposited to a thickness of about 2000 Å. Dopants are added to the a-Si layer 40 in order to form a doped a-Si ($n^+$ a-Si) layer 50 on the a-Si layer 40. Typically, the $n^+$ a-Si layer 50 is formed to a thickness of about 300 Å. When joined to metal, the $n^+$ a-Si layer 50 exhibits an ohmic contact characteristic.

The a-Si layer 40 and the $n^+$ a-Si layer 50 are patterned using anisotropic photolithography so that only a portion of the layers in the vicinity of the gate electrode 20 remain. Thus a portion of the gate insulating layer 30 corresponding to the removed portion of the layers 40 and 50 is exposed.

Referring to FIG. 1C, a thin metal layer is deposited and formed on the exposed gate insulating layer 30 over an entire surface of the substrate 100 in such a way as to cover the resulting $n^+$ a-Si layer 50. Here, the thin metal layer is made of one selected from the group consisting of Cr, Mo, and Al and is formed to a thickness of 1500 Å.

At this time, since the $n^+$ a-Si layer 50 in direct contact with the metal layer exhibits an ohmic contact characteristic, it is also called an ohmic contact layer 50.

Thereafter, a photoresist is coated on the thin metal layer. The coated photoresist is then exposed and developed in such a way as to form a photoresist pattern on portions of the thin metal layer corresponding to both sides of the gate electrode 20. The photoresist can be classified into a positive type photoresist whose exposed portion is developed (or removed) and a negative type photoresist whose exposed portion remains. In general, the positive-type photoresist is used in an array process.

By using the formed photoresist pattern as a mask, the thin metal layer is etched to expose the ohmic contact layer 50 through the resulting hole. Next, the exposed ohmic contact layer 50 is etched to expose the a-Si layer 40 therebeneath through the resulting hole.

Consequently, the non-exposed a-Si layer 40 becomes an active layer, the non-etched left and right portions of the thin metal layer respectively become a source electrode 60 and a drain electrode 65, and the exposed a-Si layer 40 becomes a channel region (ch).

The resulting a-Si TFT can be used in an AM LCD, an AM OLED, or the like. When the a-Si TFT is used in an AM LCD, the drain electrode 65 is connected to a pixel electrode in each pixel of the AM LCD.

However, the a-Si TFT has an amorphous structure due to the a-Si and thus exhibits low carrier mobility, which decreases the switching speed of the AM LCD.

Also, the a-Si TFT has other disadvantages, including unstable operation and a relatively low duty cycle.

In other words, the related art a-Si TFT is inferior to a crystalline-Si TFT in terms of characteristics such as conductivity and carrier mobility. Accordingly, there is a need for an improved method of manufacturing the crystalline-Si TFT.

Examples of crystalline-Si semiconductors include a polycrystalline-Si semiconductor, a microcrystalline (μc)-Si semiconductor, an a-Si semiconductor containing a crystalline component, and a semi-amorphous Si semiconductor having a structure which is intermediate between crystalline and non-crystalline.

Typically, a polycrystalline-Si semiconductor is obtained by forming an amorphous semiconductor layer and then crystallizing the amorphous semiconductor layer using laser beam energy. The throughput of this method is low, however, due to the small irradiation area of the laser beam. Also, the method cannot uniformly process an entire surface of a large substrate due to the insufficient stability of the laser beam.

To solve the above problems, a microcrystalline-Si TFT formed by CVD has been proposed. CVD is the same deposition technology used for the related art a-Si semiconductor.

However, in the case of the microcrystalline-Si TFT, when a microcrystalline-Si layer serving as an active layer is deposited on an amorphous layer, such as a silicon nitride (a-SiNx:H) gate insulating layer, an incubation layer is formed at the interface therebetween. This incubation layer may degrade in the characteristics of the TFT.

FIG. 2 is a view illustrating a microcrystalline silicon layer deposited on an amorphous gate insulating layer in a related art microcrystalline TFT. As shown in FIG. 2, an incubation layer 32 is formed at an interface between an amorphous gate insulating layer 30 and a microcrystalline-Si layer. This incubation layer 32 causes degradation in the characteristics of the TFT.

SUMMARY

Accordingly, the present application is directed to a TFT and a manufacturing method thereof that substantially obviate one or more problems due to limitations and disadvantages of the related art.

Described herein is a TFT and a manufacturing method thereof, in which a gate insulating layer on which a microcrystalline silicon layer is deposited, is formed using a crystalline dielectric material, such as $ZrO_2$ or $TiO_2$. As a result, the incubation layer formed beneath the microcrystalline silicon layer can be reduced in thickness and thus the characteristics and reliability of the TFT can be improved.

Additional advantages, objects, and features will be set forth in part in the description which follows and in part will become apparent to those having ordinary skill in the art upon examination of the following or from practice of the invention. The objectives and other advantages may be realized and attained by the structure particularly pointed out in the written description and claims hereof as well as the appended drawings.

In one aspect, a method for manufacturing a thin film transistor is provided, the method including: forming a gate electrode on a substrate; forming a crystalline gate insulating layer on an entire surface of the substrate having the gate electrode formed thereon; sequentially forming a microcrystalline silicon layer and a doped amorphous silicon layer on the crystalline gate insulating layer; depositing a metal layer on the substrate including the crystalline gate insulating layer, the microcrystalline silicon layer, and the doped amorphous silicon layer; and forming source/drain electrodes, an ohmic contact layer and an active layer by etching predetermined portions of the metal layer and the doped amorphous silicon layer to expose a predetermined portion of the microcrystalline silicon layer.

In another aspect, a thin film transistor is provided, the thin film transistor including: a gate electrode formed on a substrate; a crystalline gate insulating layer formed on an entire surface of the substrate having the gate electrode formed thereon; a microcrystalline silicon layer formed on the crystalline gate insulating layer; ohmic contact layers formed respectively on both upper sides of the microcrystalline silicon layer; and source/drain electrodes formed respectively on regions including the ohmic contact layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further clarification and are incorporated in and constitute a part of this application, illustrate various embodiment(s) and together with the description serve an explanatory purpose. In the drawings.

DETAILED DESCRIPTION

Reference will now be made in detail to the preferred embodiments, examples of which are illustrated in the accompanying drawings. Wherever possible, the same reference numbers will be used throughout the drawings to refer to the same or like parts.

Figure 1A:
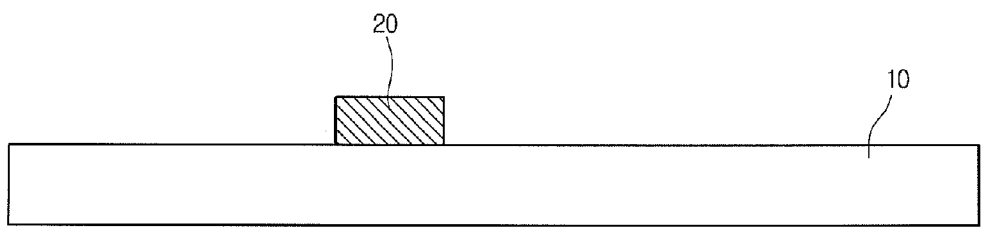
FIGS. 1A to 1C are cross-sectional views illustrating a manufacturing process for a related art TFT.
Figure 1B:
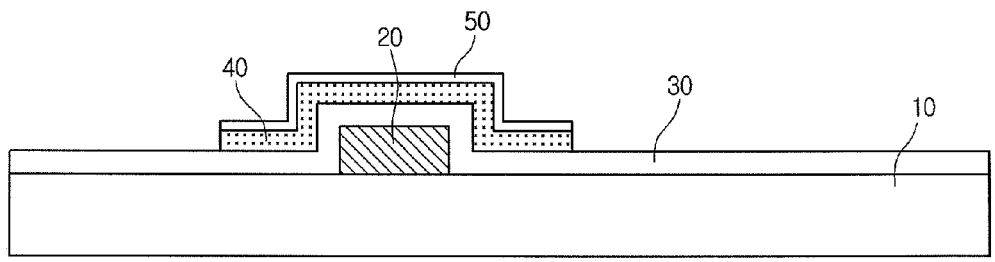
Figure 1C:
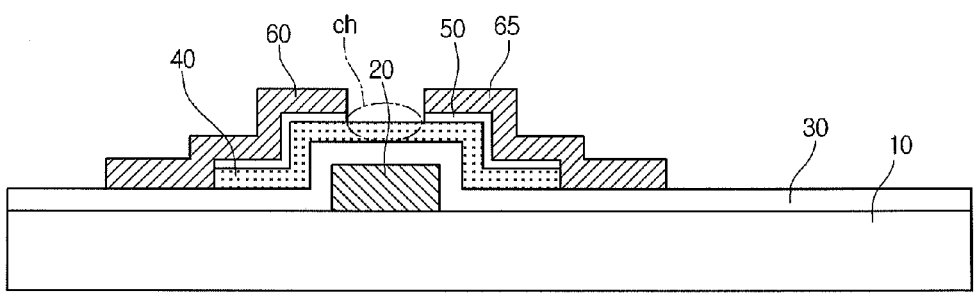
Figure 2:
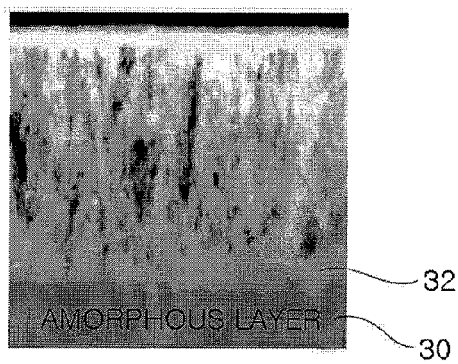
FIG. 2 is a view illustrating a microcrystalline silicon layer deposited on an amorphous gate insulating layer in a related art microcrystalline TFT.
Figure 3A:
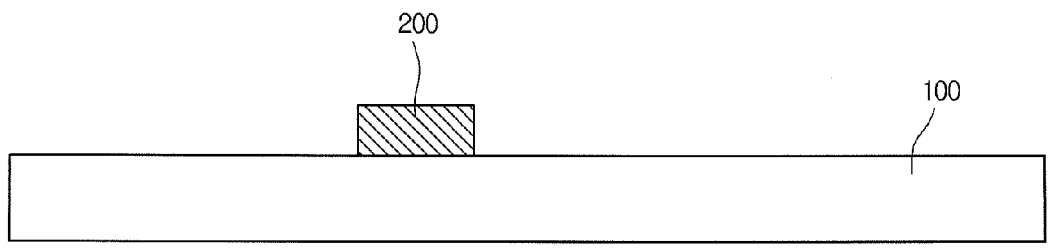
FIGS. 3A to 3D are cross-sectional views illustrating a manufacturing process for a TFT according to a first embodiment.
Figure 3B:
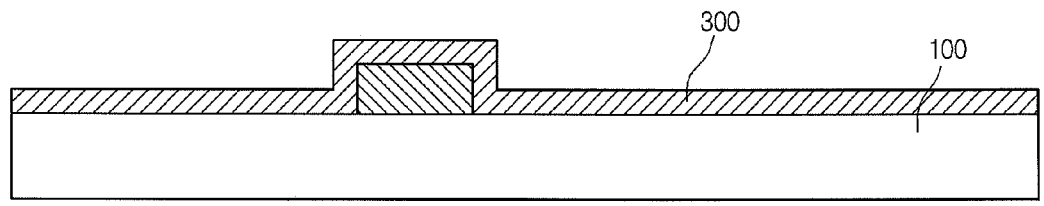
Figure 3C:
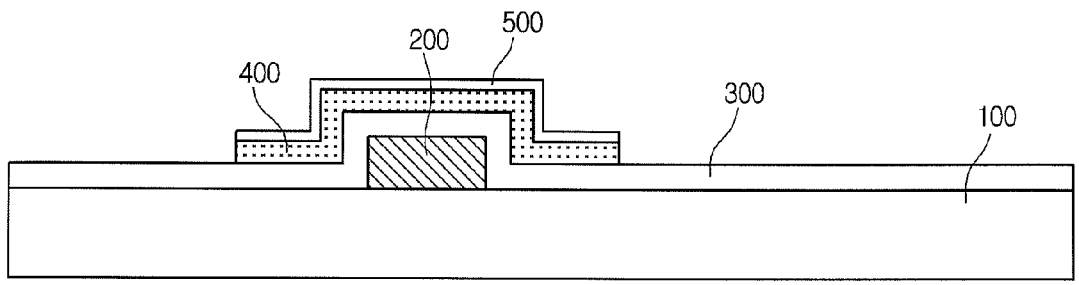

FIGS. 3A to 3C are cross-sectional views illustrating a manufacturing process for a TFT according to a first embodiment.

Referring first to FIG. 3A, a conductive metal, for example, Al or AlNd, is deposited on a substrate 100 through a sputtering process or the like, thereby forming a metal layer on the substrate 100. Thereafter, the metal layer is patterned through photolithography in order to form a gate electrode 200 on the substrate 100.

Referring to FIG. 3B, a gate insulating layer 300 is formed on the entire surface of the substrate 100 in such a way as to cover the gate electrode 200 formed on the substrate 100.

The gate insulating layer 300 is made of crystalline insulating material, in order to prevent degradation of the characteristics of the TFT, which can be caused by the incubation layer formed when a microcrystalline-Si layer serving as an active layer is deposited on an amorphous layer, such as a silicon nitride (a-SiNx:H) gate insulating layer, as in the related art microcrystalline-Si TFT.

The crystalline gate insulating layer 300 is preferably made of a crystalline dielectric material such as $ZrO_2$ and $TiO_2$. When a microcrystalline-Si layer (µc-Si) is deposited on a crystalline gate insulating layer 300, an incubation layer formed at the interface therebetween can be greatly reduced in thickness, thereby enabling an improvement in the reliability of the TFT.

Also, since either a $ZrO_2$ layer or a $TiO_2$ layer can be deposited at a low temperature through atomic layer deposition (ALD), the crystalline gate insulating layer 300 can be applied to a flexible substrate, such as a plastic substrate.

Referring to FIG. 3C, a µc-Si layer 400 is deposited on the gate insulating layer 300 by chemical vapor deposition (CVD). Thereafter, dopants are added to the μc-Si layer 400 in order to form a doped a-Si (n⁺ a-Si) layer 500 on the μc-Si layer 400. When joined to metal, the n⁺ a-Si layer 500 exhibits an ohmic contact characteristic.

The μc-Si layer 400 and the n⁺ a-Si layer 500 are patterned using anisotropic photolithography so that only the portion corresponding to the gate electrode 200 remains. Thus, a portion of the gate insulating layer 300 corresponding to the removed portion of the layers 400 and 500 is exposed.

Figure 3D:
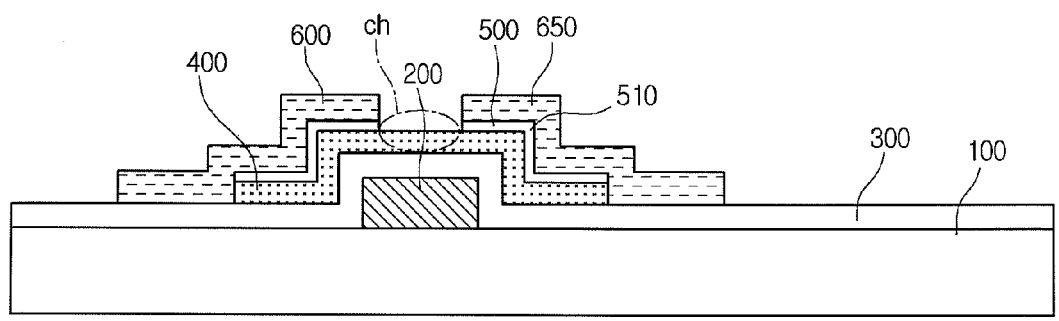

Referring to FIG. 3D, a thin metal layer is deposited and formed on the exposed gate insulating layer 300 over an entire surface of the substrate 100 in such a way as to cover the resulting n⁺ a-Si layer 500. Here, the thin metal layer is made of one selected from the group consisting of Cr, Mo, and Al.

Since the n⁺ a-Si layer 500 in direct contact with the metal layer exhibits an ohmic contact characteristic, it is also called an ohmic contact layer 510.

Thereafter, photoresist is coated on the thin metal layer. The coated photoresist is then exposed and developed in such a way as to form a photoresist pattern on portions of the thin metal layer corresponding to both sides of the gate electrode 200. The photoresist can be classified into a positive type photoresist whose exposed portion is developed (or removed) and a negative type photoresist whose exposed portion remains. In general, the positive-type photoresist is used in an array process.

By using the formed photoresist pattern as a mask, the thin metal layer is etched to expose the ohmic contact layer 510 through the resulting hole. Next, the exposed ohmic contact layer 510 is etched to expose the μc-Si layer 400 therebeneath through the resulting hole.

Consequently, the non-exposed portion of the μc-Si layer 400 becomes an active layer, the non-etched left and right portions of the thin metal layer respectively become a source electrode 600 and a drain electrode 650, and the exposed μc-Si layer 400 becomes a channel region ch.

The resulting μc-Si TFT can be used in an AM LCD, an AM OLED, or the like. When the μc-Si TFT is used in an AM LCD, the drain electrode 650 is connected to a pixel electrode in each pixel of the AM LCD.

In detail, a passivation layer is formed to cover the source and drain electrodes 600 and 650, and then the formed passivation layer is patterned through photolithography, thereby forming a contact hole for exposing the drain electrode. Next, a transparent conductive material such as indium-tin oxide (ITO) is deposited on the passivation layer, and then the resulting conductive material layer is patterned. Thereafter, a pixel electrode is electrically connected to the drain electrode 650.

The resulting μc-Si TFT may be installed in an LCD or an OLED in a matrix pattern. When a gate voltage is applied to the gate electrode 200, electrons generated at the source electrode 600 pass through the ohmic contact layer 510 formed beneath the source electrode 600, the active layer 400, and through the channel region ch formed in the active layer 400. The electrons having passed through the channel region ch tunnel through the ohmic contact layer 510 formed beneath the drain electrode 650 and then move into the drain electrode 650. In this manner, the μc-Si TFT serves as a switching or driving device.

FIGS. 4A to 4D are cross-sectional views illustrating a manufacturing process for a TFT according to a second embodiment.

The second embodiment is substantially identical to the first embodiment with the exception that a gate insulating layer is formed as a double layer. Therefore, the same reference numbers will be used in the first and second embodiments to refer to the same or like parts. Also, in describing the second embodiment, a detailed description about the same elements as in the first embodiment will be omitted for simplicity.

Figure 4A:
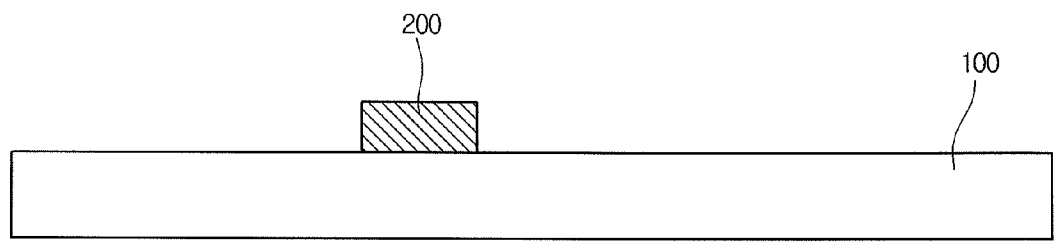
FIGS. 4A to 4D are cross-sectional views illustrating a manufacturing process for a TFT according to a second embodiment.

Referring to FIG. 4A, a conductive metal, for example, Al or AlNd, is deposited on a substrate 100 by a sputtering process or the like in order to form a metal layer on the substrate 100. Thereafter, the metal layer is patterned through photolithography, thereby forming a gate electrode 200 on the substrate 100.

Figure 4B:
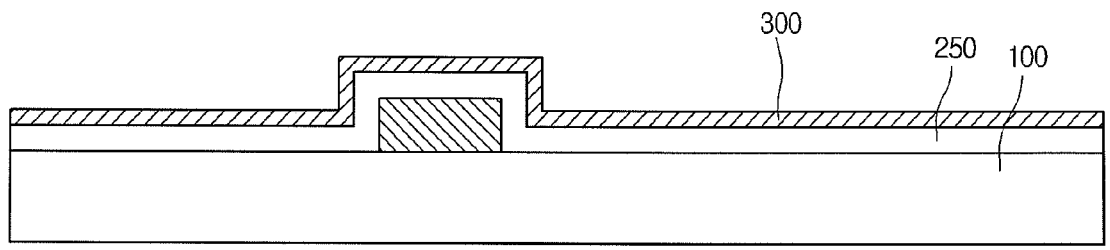

Referring to FIG. 4B, a first gate insulating layer 250 and a second gate insulating layer 300 are sequentially formed on an entire surface of the substrate 100 in such a way as to cover the gate electrode 200 formed on the substrate 100.

At this time, the first gate insulating layer 250 is made of an amorphous insulating material such as SiNx, as is the related art gate insulating layer, and the second gate insulating layer 300 is made of a crystalline insulating material.

The second gate insulating layer 300 made of a crystalline insulating material prevents degradation of the characteristics of the TFT, which can be caused by the incubation layer formed when a microcrystalline-Si layer serving as an active layer is deposited on an amorphous layer, such as a silicon nitride (a-SiNx:H) gate insulating layer.

The second gate insulating layer 300 is preferably made of a crystalline dielectric material such as $ZrO_2$ or $TiO_2$. When a μc-Si layer is deposited on the second gate insulating layer 300 made of a crystalline dielectric material, the incubation layer formed at the interface therebetween can be greatly reduced in thickness, thereby enabling an improvement in the reliability of the TFT.

Also, since either a $ZrO_2$ layer or a $TiO_2$ layer can be deposited at a low temperature through ALD, the second gate insulating layer 300 also can be applied to a flexible substrate such as a plastic substrate.

Figure 4C:
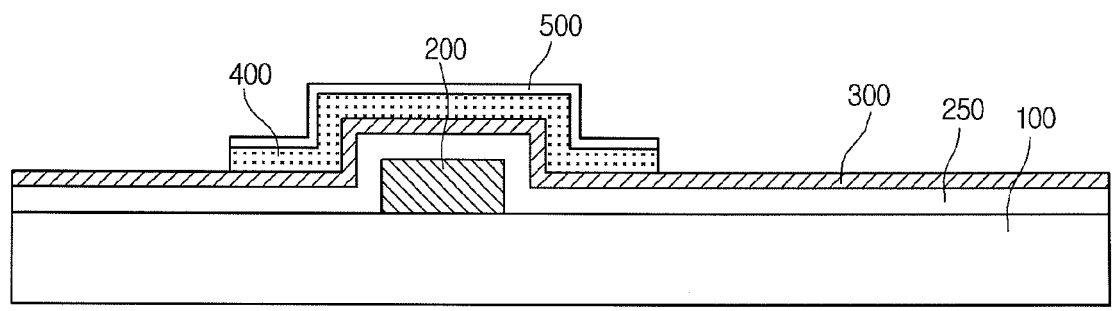
Figure 4D:
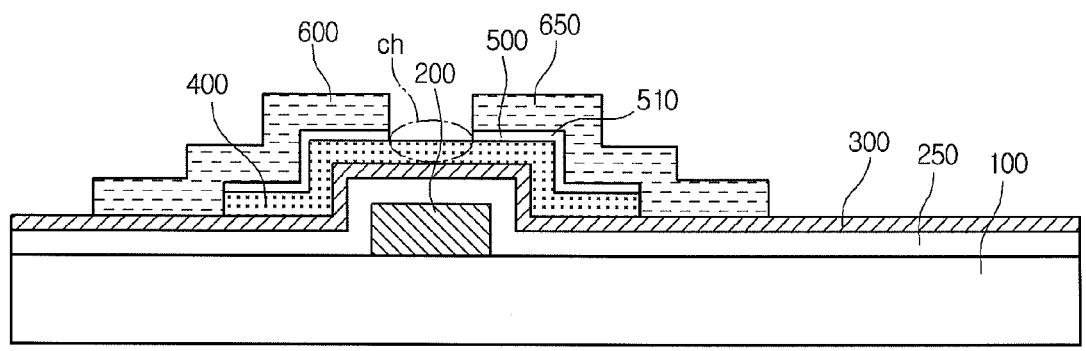

The remaining processes illustrated in FIGS. 4C and 4D are identical to those in FIGS. 3C and 3D, and thus their description will be omitted for simplicity.

FIGS. 5A to 5D are views illustrating the thickness of an incubation layer formed beneath a microcrystalline silicon layer. FIG. 6 is a graph illustrating the relationship between the deposition temperature of a crystalline gate insulating layer and the thickness of the incubation layer that is formed at the interface between the crystalline gate insulating layer and a μc-Si layer formed thereon.

Figure 5A:
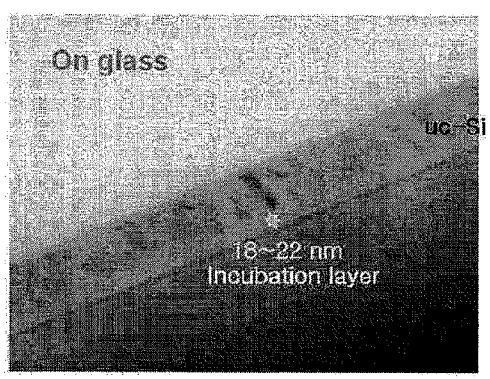
FIGS. 5A to 5D are views illustrating the thickness of an incubation layer formed beneath a microcrystalline silicon layer.
Figure 6:
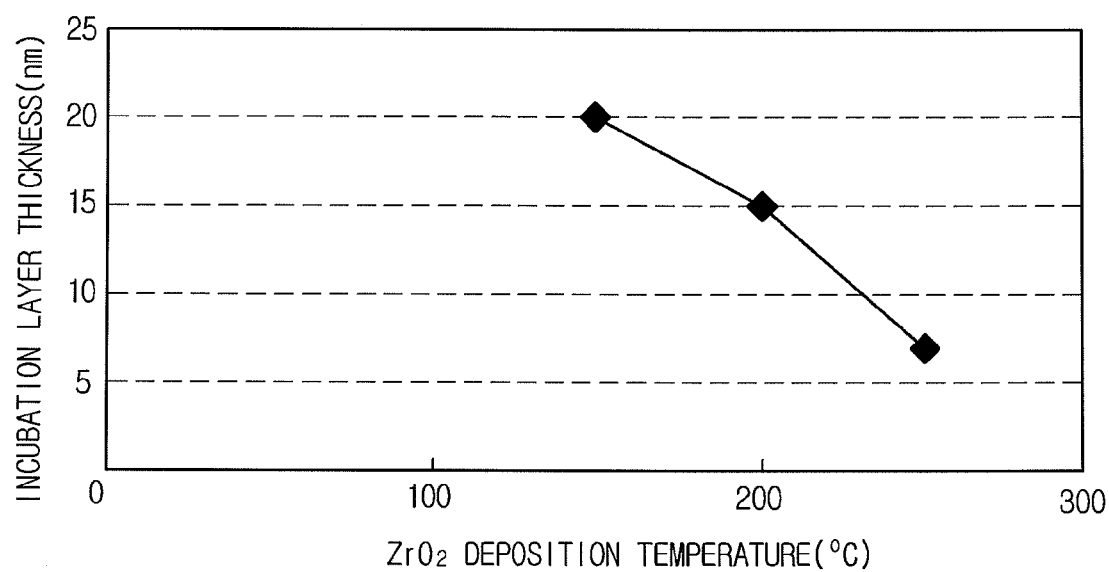
FIG. 6 is a graph illustrating the relationship between the deposition temperature of a crystalline gate insulating layer and the thickness of an incubation layer formed thereon.

FIG. 5A illustrates the thickness of the incubation layer that is formed at the interface between an amorphous glass substrate (such as an amorphous SiNx layer) and a μc-Si layer deposited thereon. As can be seen from FIG. 5A, the incubation layer has a thickness of about 18 nm to about 22 nm.

Figure 5B:
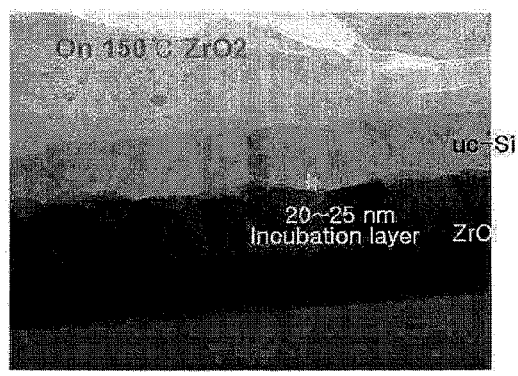
Figure 5C:
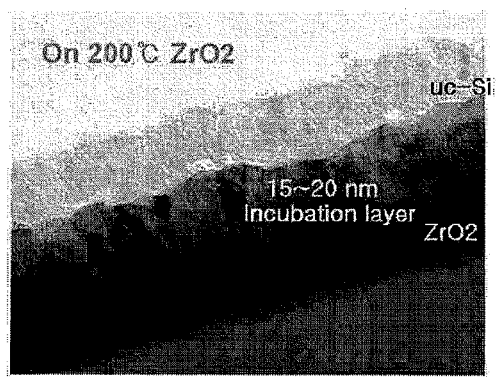
Figure 5D:
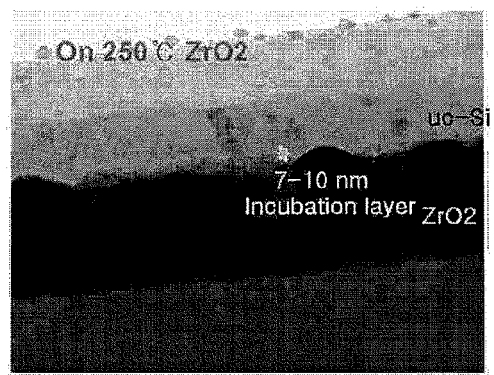

FIGS. 5B to 5D illustrate the thickness of an incubation layer that is formed at the interface between a crystalline gate insulating layer of $ZrO_2$ and a μc-Si layer deposited thereon. In FIG. 5B, the deposition temperature of the crystalline gate insulating layer is 150° C.; in FIG. 5C, the deposition temperature of the crystalline gate insulating layer is 200° C.; and in FIG. 5D, the deposition temperature of the crystalline gate insulating layer is 250° C. As can be seen from FIGS. 5B and 5D, as the deposition temperature of the crystalline gate insulating layer increases, the crystallinity of the $ZrO_2$ layer increases and consequently the thickness of the incubation layer is reduced.

Specifically, when the deposition temperature of the crystalline gate insulating layer is 150° C. as in FIG. 5B, the thickness of the incubation layer is about 20 nm to about 25 nm. Comparatively, the thickness is about 15 nm to about 20 nm when the deposition temperature is 200° C. as in FIG. 5C, and the thickness is about 7 nm to about 10 nm when the deposition temperature is 250° C., as in FIG. 5D. These results is illustrated in the graph in FIG. 6.

As mentioned above, when a μc-Si layer is deposited on a crystalline gate insulating layer, the incubation layer formed at the interface therebetween can be reduced in thickness. It has been shown that the thickness of the incubation layer can be minimized by adjusting the deposition temperature of the crystalline gate insulating layer.

As described above, the gate insulating layer beneath the μc-Si layer may be formed using crystalline $ZrO_2$ or $TiO_2$. Accordingly, the incubation layer beneath the μc-Si layer can be reduced in thickness and thus the characteristics and reliability of the TFT can be improved. Also, when the above TFT is used as a driving device in an AM OLED, the lifetime of the AM OLED can be increased.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A thin film transistor comprising:
    a gate electrode disposed on a substrate;
    a first gate insulating layer disposed on a surface of the substrate having the gate electrode disposed thereon;
    a second gate insulating layer disposed on the first gate insulating layer;
    a third gate insulating layer disposed on the second gate insulating layer;
    a source electrode and a drain electrode disposed above the second gate insulating layer,
    wherein the first gate insulating layer comprises an amorphous insulating material and the second gate insulating layer comprises a crystalline dielectrice material,
    wherein the third gate insulating layer comprises a microcrystalline silicon.

2. The thin film transistor according to claim 1, wherein the crystalline dielectric material comprises ZrO 2or TiO 2.

3. The thin film transistor according to claim 1, wherein ohmic contact layers are disposed respectively on both upper sides of the third gate insulating layer.

4. The thin film transistor according to claim 1, further comprising:
    a contact hole for exposing the drain electrode, the contact hole being formed by patterning a passivation layer deposited to cover the source electrode and the drain electrode; and
    a pixel electrode electrically connected to the drain electrode, the pixel electrode being formed by depositing a transparent conductive material on the passivation layer.

5. The thin film transistor according to claim 4, wherein the transparent conductive material is indium-tin oxide (ITO).

6. A thin film transistor comprising:
    a gate electrode disposed on a substrate;
    a first gate insulating layer disposed on a surface of the substrate having the gate electrode disposed thereon;
    a second gate insulating layer disposed on the first gate insulating layer;
    a third gate insulating layer disposed on the second gate insulating layer;
    ohmic contact layers disposed respectively on both upper sides of the third gate insulating silicon layer; and
    a source electrode and a drain electrode disposed respectively on regions including the ohmic contact layers,
    wherein the first gate insulating layer comprises an amorphous insulating material and the second gate insulating layer comprises a crystalline dielectrice material,
    wherein the third gate insulating layer comprises a microcrystalline silicon.

7. The thin film transistor according to claim , wherein the crystalline dielectric material comprises ZrO 2or TiO 2.

8. The thin film transistor according to claim 6, further comprising:
    a contact hole for exposing the drain electrode, the contact hole being formed by patterning a passivation layer deposited to cover the source electrode and the drain electrode; and
    a pixel electrode electrically connected to the drain electrode, the pixel electrode being formed by depositing a transparent conductive material on the passivation layer.

9. The thin film transistor according to claim 8, wherein the transparent conductive material is indium-tin oxide (ITO).

* * * * *